(12) United States Patent
Perry et al.

(10) Patent No.: US 6,858,111 B2
(45) Date of Patent: Feb. 22, 2005

(54) CONDUCTIVE POLYMER INTERCONNECTION CONFIGURATIONS

(75) Inventors: Charles H. Perry, Poughkeepsie, NY (US); Mark G. Courtney, Poughkeepsie, NY (US); Lewis S. Goldmann, Bedford, NY (US); Gregory B. Martin, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 09/911,069

(22) Filed: Jul. 23, 2001

(65) Prior Publication Data

US 2002/0028327 A1 Mar. 7, 2002

Related U.S. Application Data

(62) Division of application No. 09/580,131, filed on May 30, 2000, now Pat. No. 6,333,104.

(51) Int. Cl.$^7$ .............................................. C09J 5/00
(52) U.S. Cl. ................... 156/327; 156/307.7; 257/737; 438/614
(58) Field of Search .............................. 156/307.7, 327; 174/260; 257/737, 738, 778, 780; 438/612, 614

(56) References Cited

U.S. PATENT DOCUMENTS

| | | | |
|---|---|---|---|
| 4,997,122 A | 3/1991 | Zimmer | |
| 5,545,465 A | 8/1996 | Gaynes et al. | |
| 5,641,113 A | 6/1997 | Somaki et al. | |
| 5,747,101 A | 5/1998 | Booth et al. | |
| 5,816,478 A | 10/1998 | Kaskoun et al. | |
| 5,854,514 A | 12/1998 | Roldan et al. | 257/746 |
| 5,883,432 A | * 3/1999 | Higashiguchi | 257/727 |
| 5,925,930 A | 7/1999 | Farnworth et al. | 257/737 |
| 6,270,193 B1 | * 8/2001 | Hiwada | 347/50 |
| 6,337,522 B1 | * 1/2002 | Kang et al. | 257/784 |
| 6,441,485 B1 | * 8/2002 | Glenn | 257/727 |

FOREIGN PATENT DOCUMENTS

JP            09323415 A    * 12/1997       B41J/2/045

OTHER PUBLICATIONS

English abstract of JP 09323415.*
"Worldwide Trends in Flip Chip Developments" Vardaman 1999.*
IBM Technical Disclosure Bulletin—"Solder Plated Resin Ball" Published May 1995.*

* cited by examiner

Primary Examiner—Jeff H. Aftergut
Assistant Examiner—John L. Goff
(74) Attorney, Agent, or Firm—Margaret A. Pepper; Cantor Colburn LLP

(57) ABSTRACT

A method of forming an electrical connection between two devices is disclosed. In an exemplary embodiment of the invention, the method includes soldering a second solderable cap of an interconnection to a first contact pad of a first component. The interconnection further includes a conductive polymer comprising a polymer component and a conductive component A first solderable cap is disposed in contact with the conductive polymer, and the second solderable cap is disposed in contact with the conductive polymer opposite the first solderable cap. The first solderable cap is then soldered to a second contact pad of a second component.

17 Claims, 13 Drawing Sheets

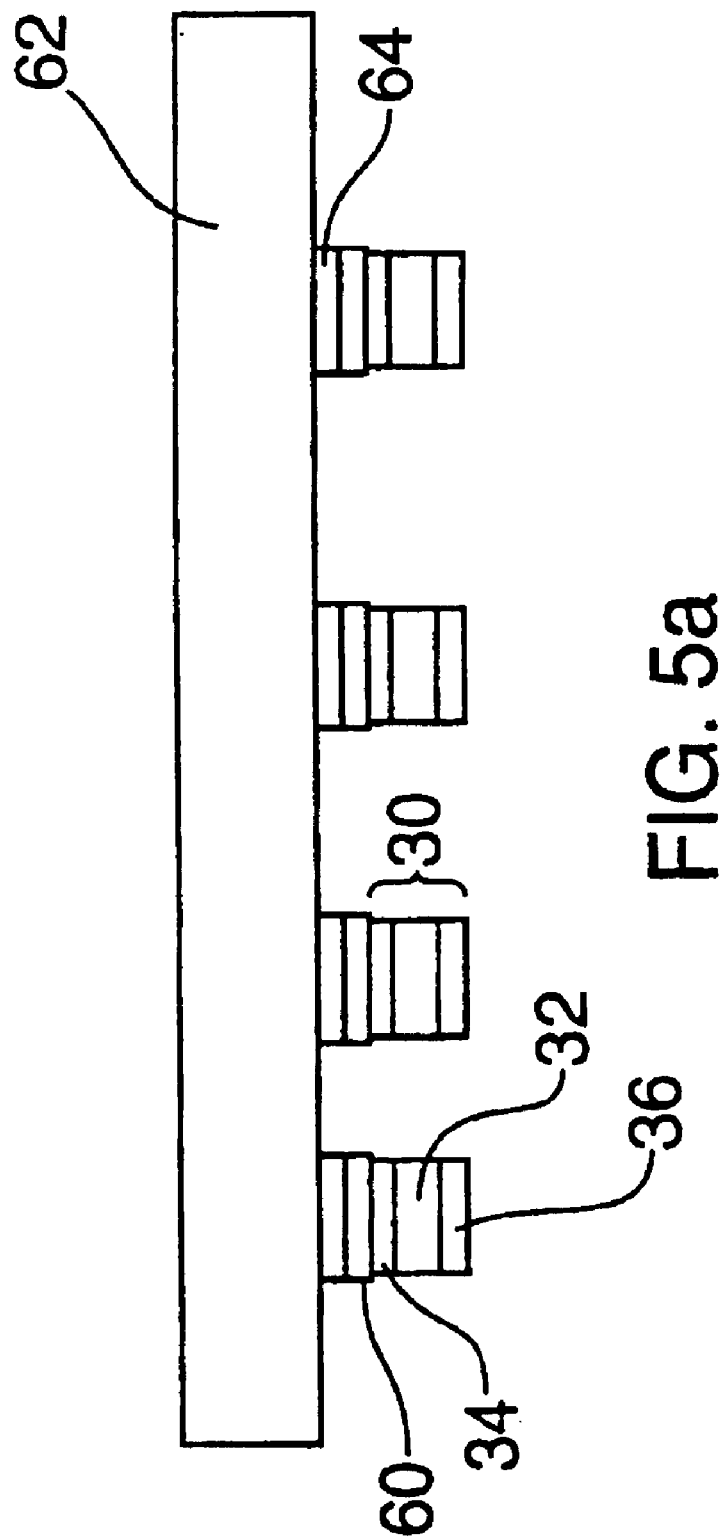

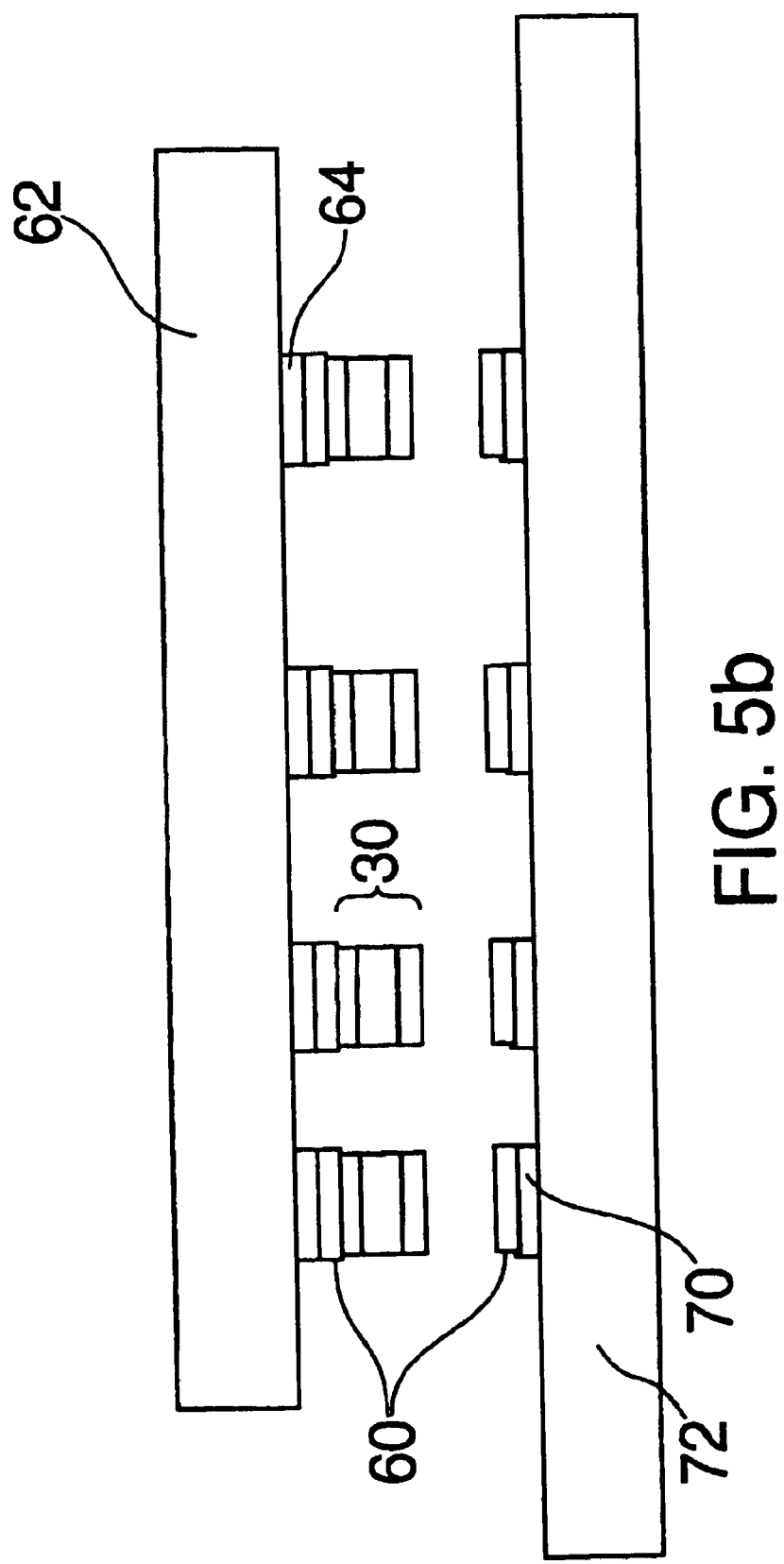

CONDUCTIVE POLYMER INTERCONNECTION CONFIGURATIONS

CROSS-REFERENCE TO RELATED APPLICATIONS

The following is a divisional application of application Ser. No. 09/580,131, filed on May 30, 2000, now U.S. Pat. No. 6,333,104.

BACKGROUND OF THE INVENTION

The present invention relates generally to the coupling of two electrical devices, and specifically to the coupling of integrated circuit chips to electronic cards using interconnections comprising conductive polymers.

Electrical components such as semiconductor devices and integrated circuit chips are, in general, mounted on a printed circuit board or "card" in order to be electrically connected with other electrical devices. The electrical connection from the first electrical component to the second electrical component is formed between external electrodes or contact pads on the first component to contact pads on the second component. The contact pads on each component are arranged to align with the matching contact pads on the other component.

Various methods for connecting the contact pads on the first component with the contact pads on the other component are known in the art, including use of ball grid arrays (BGAs), column grid arrays (CGAs), and land grid arrays (LGAs). For example, electrically conductive bonds that mechanically and electrically connect the first component and the second component at each pair of matching contact pads can be formed using solder balls. Solder balls are units of essentially sphere-shaped, solidified solder that have been applied to the contact pads of the first component. When all of the desired contact pads on the first component have had a solder ball applied, the component is said to comprise a "ball grid array", or bump grid array. The ball grid array is placed so as to align each solder ball on the first component with the matching contact pads on the second component. FIG. 1a shows an electrical component with a ball grid array aligned over the substrate of a second component generally at 10. The first component 12 has a plurality of contact pads 14, onto each of which is affixed a solder ball 16. The second component substrate 18 has contact pads 20 aligned in a matching configuration to the first component contact pads 14.

FIG. 1b shows the configuration of the ball grid array after the solder balls 16 in the ball grid array have been placed in contact with the contact pads 20 on the second component substrate 18. Typically, the first component 12 is positioned in a parallel plane to the second component substrate 18, and a slight force is applied to the first component 12 to ensure contact between the entire ball grid array and the contact pads 20 on the second component substrate 18. The ball grid array is then heated, which causes the solder to reflow. The assembly is then allowed to cool. As shown in FIG. 1c, the final assembly comprises soldered interconnections 22 between the contact pads 14 of the first component 12 and the contact pads 20 of the second component substrate 18.

Conventional ball grid arrays, however, are not sufficiently resistant to interconnection breakage caused by differential expansion of the components. As the distance from the neutral point (where little or no interconnection stress occurs) of an interconnection increases, the reliability of that interconnection diminishes, because greater shear stresses are imparted on the interconnection.

Techniques have been developed to increase the distance between an electrical component and the substrate it is mounted on in order to provide for longer interconnections than can be achieved with a simple ball grid array. For example, multiple layers of solder balls or conductor layers can be used to increase the final distance between the component and the substrate (See, for example, U.S. Pat. No. 5,816,478 to Kaskoun and U.S. Pat. No. 5,641,113 to Somaki et al.). Although such lengthened interconnections are useful for larger substrates, the interconnections cannot be formed close enough to each other on a single substrate to allow use in many applications that require a higher density of interconnections on a component.

Interconnections formed through the various conventional techniques described above produce soldered connections that are prone to malfunction because the interconnections are relatively inflexible and therefore unable to withstand shearing forces created by the differing coefficients of thermal expansion of the materials in the components and interconnections.

What is needed in the art is an interconnection that allows for the ready incorporation of flexible and durable interconnections between the contact pads of two electrical devices.

BRIEF SUMMARY OF THE INVENTION

The above-described and other disadvantages of the prior art are overcome or alleviated by a method of forming an electrical connection between two devices. In an exemplary embodiment of the invention, the method includes soldering a second solderable cap of an interconnection to a first contact pad of a first component. The interconnection further includes a conductive polymer comprising a polymer component and a conductive component A first solderable cap is disposed in contact with the conductive polymer, and the second solderable cap is disposed in contact with the conductive polymer opposite the first solderable cap. The first solderable cap is then soldered to a second contact pad of a second component.

In a preferred embodiment, the polymer component includes one of a: nylon, polysulfone, polyester, polyimide, siloxane, ethylene, vinyl acetate, aryl-ether, polyutethane, polyisocyanate, polyether, polyester, acrylate, or polyvinyl chloride. The conductive particles include one of: gold, silver, palladium, oxide free noble alloys of gold, silver, and palladium, or a noble metal. The first solderable cap and the second solderable cap include one of: gold, nickel, silver, copper, zinc, palladium, platinum, indium, tin, bismuth, or lead.

The above-described and other features and advantages of the present invention will be appreciated and understood by those skilled in the art from the following detailed description, drawings, and appended claims.

BRIEF DESCRIPTION OF THE DRAWINGS

The device and method of the present invention will now be described by way of example only, with reference to the accompanying drawings, which are meant to be exemplary, not limiting, and wherein like elements are numbered alike in several FIGURES, in which:

FIG. 5a is a cross sectional view of one embodiment of conductive polymer interconnections affixed to the contact pads of an electrical component;

FIG. 5b is a cross sectional view of the conductive polymer interconnections of FIG. 5a after a second electrical component has been aligned with the conductive polymer interconnections;

DETAILED DESCRIPTION OF THE INVENTION

The conductive polymer interconnection described herein comprises a conductive polymer material disposed between two layers of a solderable material, or between a solderable material and the contact pad of an electrical device. In either case, the conductive polymer material has adhesive properties, and is bonded to adjacent conductors. The resulting conductive polymer interconnection provides a flexible, yet strong connection between electrical devices, without significantly complicating incorporation of the interconnections during component fabrication. While the interconnection will be described in relation to fabrication of electrical devices, it is understood that the conductive polymer interconnection described herein is equally applicable to temporary bonding methods, such as "known good die" tests.

Further, for clarity and convenience, the conductive polymer interconnections will be described as joining an electrical component such as a packaged integrated circuit (IC) substrate to a card, but those skilled in the art will recognize that the methods and devices described herein are generally applicable to the joining of two electrical devices.

Figure 1A:
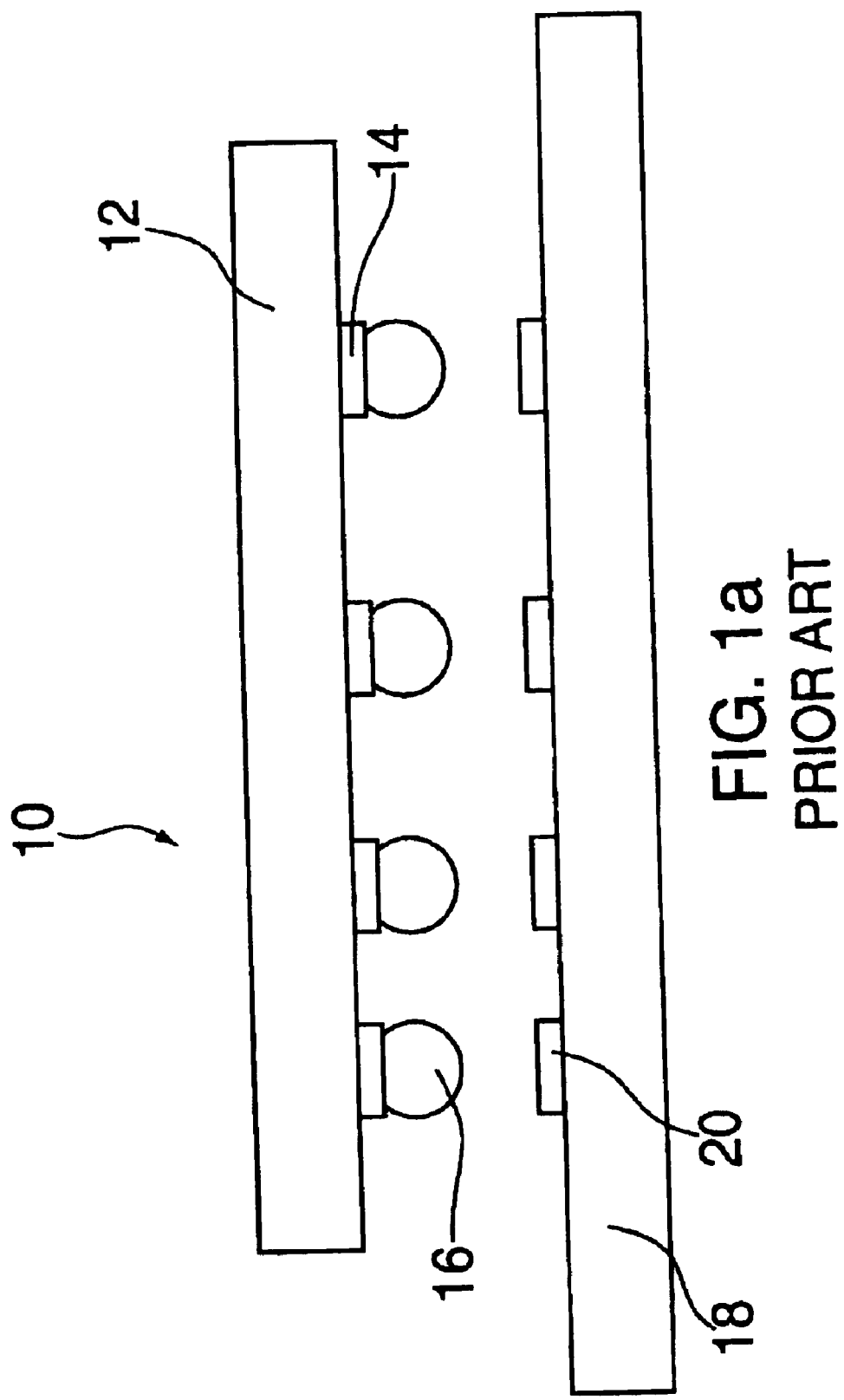
FIG. 1a is a cross section of a prior art electrical component with a ball grid array and a substrate prior to physical contact.
Figure 1B:
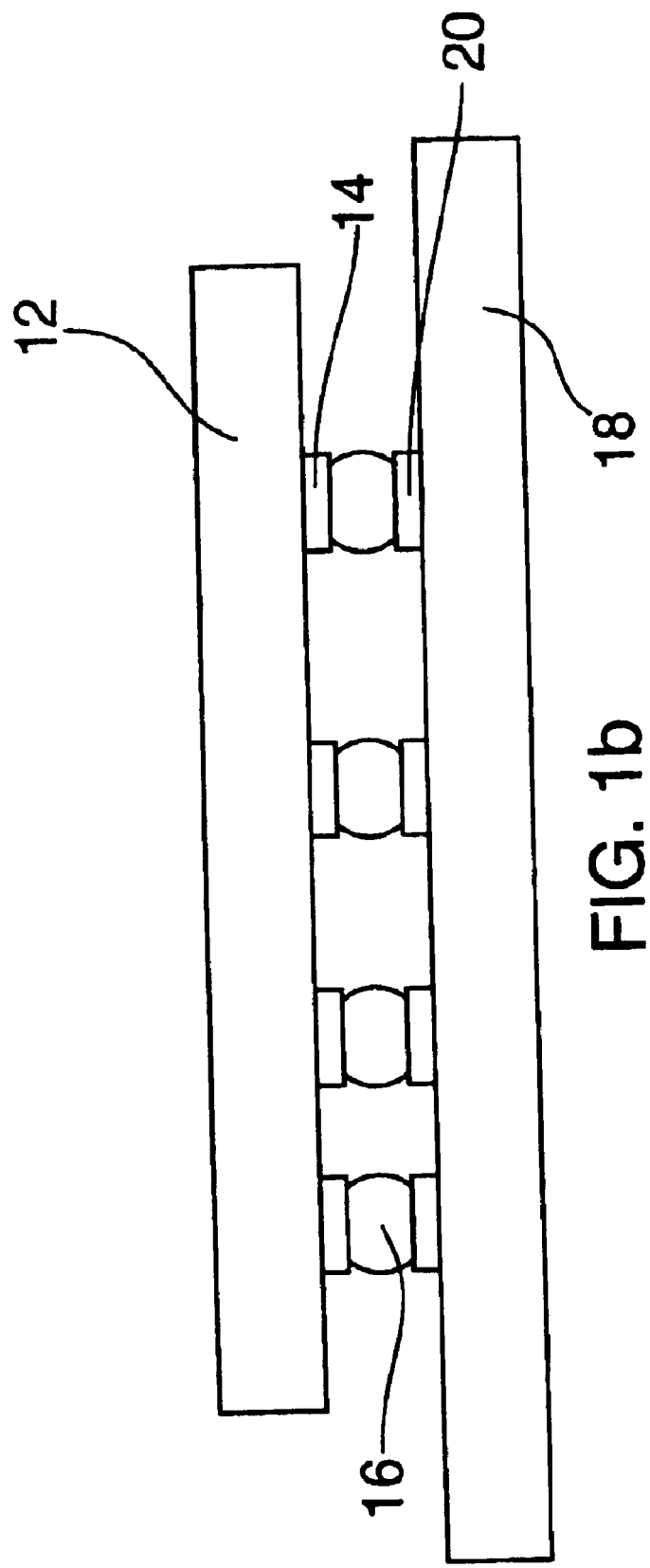
FIG. 1b is a cross section of the prior art electrical component and substrate of FIG. 1 with the ball grid array moved into contact with the contact pads of the substrate.
Figure 1C:
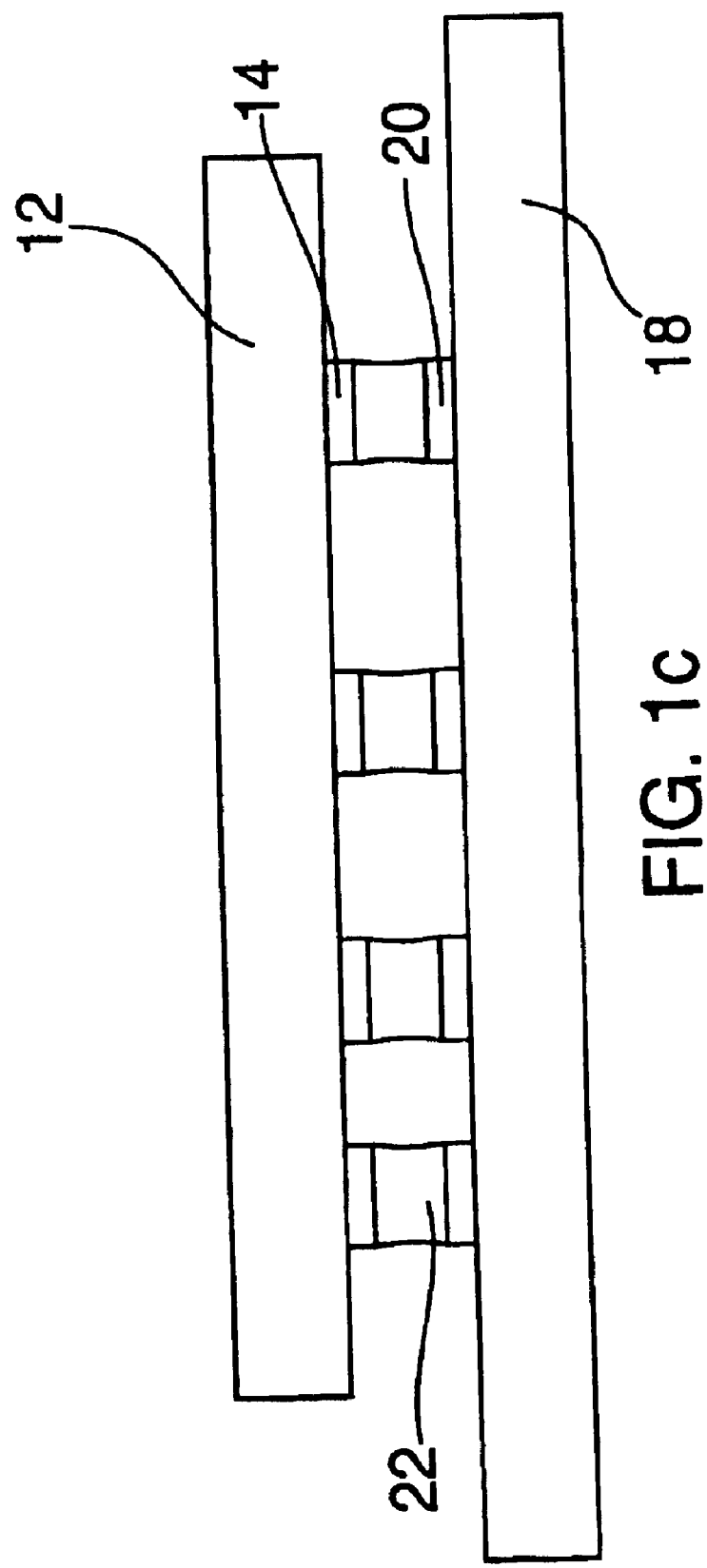
FIG. 1c is a cross section of the prior art electrical component and substrate of FIG. 1b after reflow of the solder balls in the ball grid array.
Figure 2:
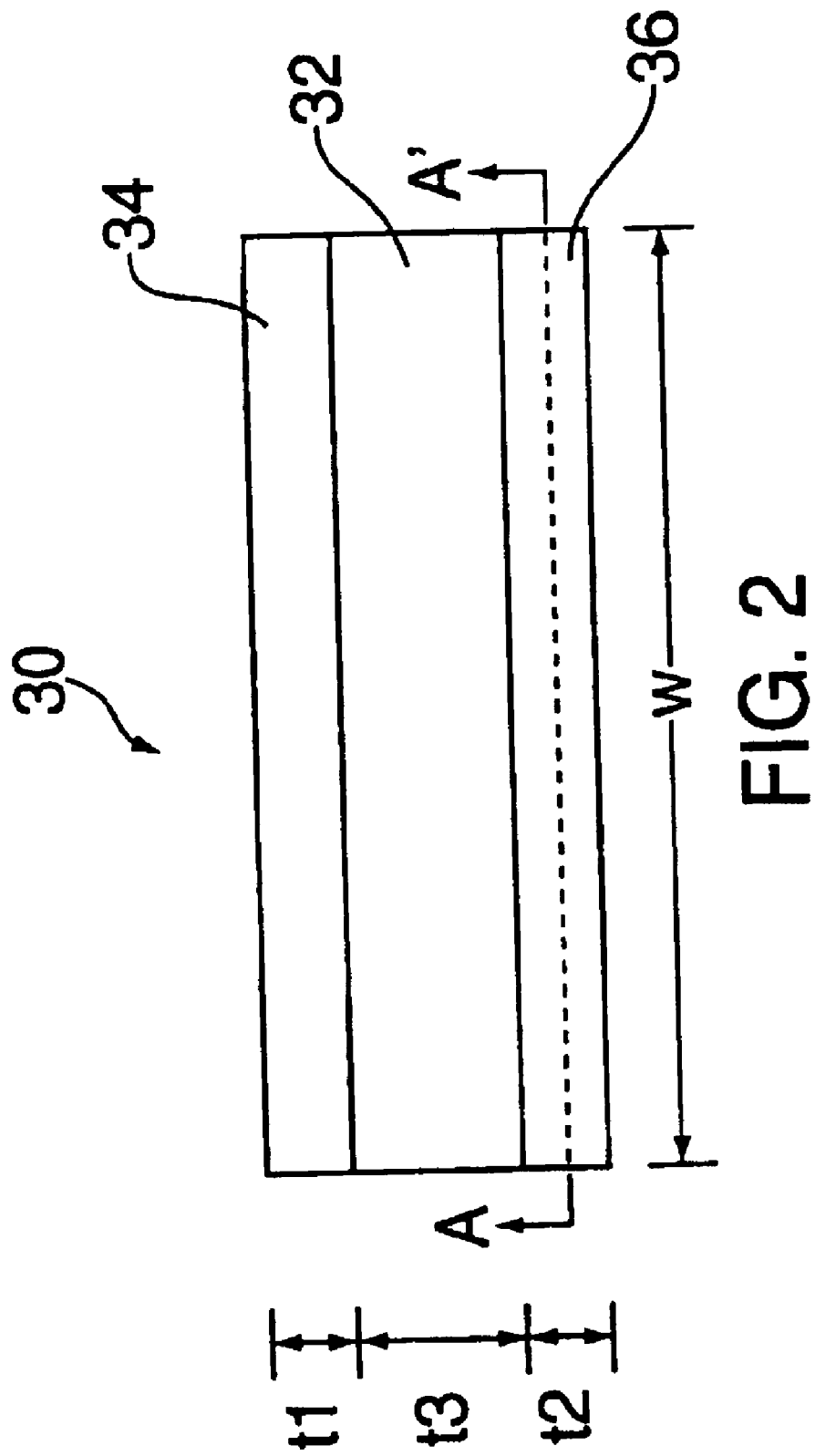
FIG. 2 is a cross sectional view of one embodiment of a conductive polymer interconnection.

Referring now to FIG. 2, one embodiment of a conductive polymer interconnection is shown generally at 30. The conductive polymer interconnection 30 comprises a conductive polymer 32 disposed between and in physical contact with a second solderable cap 34 and a first solderable cap 36. The conductive polymer 32 has adhesive properties, and it adheres to both solderable caps 34, 36 to form the conductive polymer interconnection 30 of this embodiment. The shape and size of the solderable caps 34, 36 and conductive polymer 32 can be any shape and size that suits the particular application in which the conductive polymer interconnection 30 will be used. The shape of the solderable caps 34, 36 and conductive polymer 32 layers, when viewed through cross section A-A', can be, for example, circular, triangular, rectangular, elliptical, quadrilateral, and polygonal, among others. The solderable caps 34, 36 and conductive polymer 32 layers can each have different shapes or similar shapes as seen in cross section A-A' in this embodiment, with substantially similar shapes preferred.

The width "w" of each of the solderable caps 34, 36 and conductive polymer 32 is dependent upon the application, and can be the same or different for each of the solderable caps 34, 36 and conductive polymer 32, with the same width "w" preferred. The width "w" is sufficient to provide the desired electrical characteristics while providing solid contact surfaces, with a width "w" of about 0.010 inches to about 0.050 preferred, and a width "w" of about 0.015 inches to about 0.035 inches especially preferred.

The thickness "t1" of the second solderable cap 34 can be the same as or different from the thickness "t2" of the first solderable cap 36, and the thickness of the conductive polymer 32 "t3" can be the same as or different from either or both of the solderable caps 34, 36. The thicknesses of the solderable caps 34, 36 is sufficient to provide a bonding surface for the conductive polymer 32 and to provide enough solderable material to allow for a sufficiently strong solder joint. In a preferred embodiment, the solderable caps 34, 36 have approximately equivalent thicknesses (t1 and t2), and the conductive polymer 32 has a thickness "t3" greater than either of the thicknesses (t1 and t2) of either of the two caps 34, 36. In this embodiment, the cap thickness (t1 and t2) is about 0.002 inches to about 0.01 inches, with a cap thickness (t1 and t2) of about 0.004 to about 0.006 preferred, and the conductive polymer 32 thickness (t3) is about 0.002 inches to about 0.058 inches, with a thickness of about 0.008 inches to about 0.02 inches preferred.

The solderable caps 34, 36 can be the same or different material, with the same material preferred. Further, the solderable caps 34, 36 can have a non-uniform composition. For example, the caps 34, 36 can be formed so the surface to which the conductive polymer 32 adheres on each cap 34, 36 has characteristics favorable for such adherence, while the surface which is soldered to one of the contact pads is amenable to soldering.

Any conventional solderable material to which the conductive polymer 32 can adhere can be used for the solderable caps 34, 36. For example, the solderable caps 34, 36 can be gold, nickel, silver, copper, zinc, palladium, platinum, indium, tin, bismuth, lead, and the like, and combinations comprising at least one of the foregoing, with nickel, copper, and gold preferred. Additives can be included in all or part of each solderable cap 34, 36 in order to improve the solderability of the solderable caps 34, 36, or to improve the adherence to the conductive polymer 32.

The conductive polymer 32 can comprise any polymer composition that provides sufficient adherence to the solderable caps 34, 36, sufficient conductivity, and sufficient physical flexibility and durability. U.S. Pat. No. 5,747,101 to Booth et al. discloses several exemplary polymers that can be used, and is herein incorporated by reference in its entirety.

Exemplary conductive polymers 32 comprise polymer systems with a conductive component and a polymer component. The conductive component preferably comprises electrically conductive particles covered by, coated with, or comprising gold, silver, and palladium or their oxide free, noble alloys, noble metals, or other conductors and the like, among others. The particles can have any shape, including flakes, spheres, fibers, plates, rods, and disks, among others. In one embodiment, the particles have a bimodal size distribution. Preferred polymer components include thermoplastic polymers, copolymers, or blends. Examples of polymers include, but are not limited to, nylons, polysulfones, polyesters, flexible and soluble polyimides, and siloxanes. Copolymers include, but are not limited to, random, segmented or block copolymers made of ethylene and vinyl acetate (EVA), siloxane and aryl-ethers, polyurethanes composed of polyisocyanate, and polyethers or polyester segments. Blends may be of two or more polymers/copolymers such as ethylene-acrylate copolymer with polyethylene, EVA and poly (vinyl chloride) (PVC), polyester and PVC, and the like, among others. The polymer component can additionally comprise dielectric solids, which preferably include ceramic particles, quartz, or glass.

Figure 3:
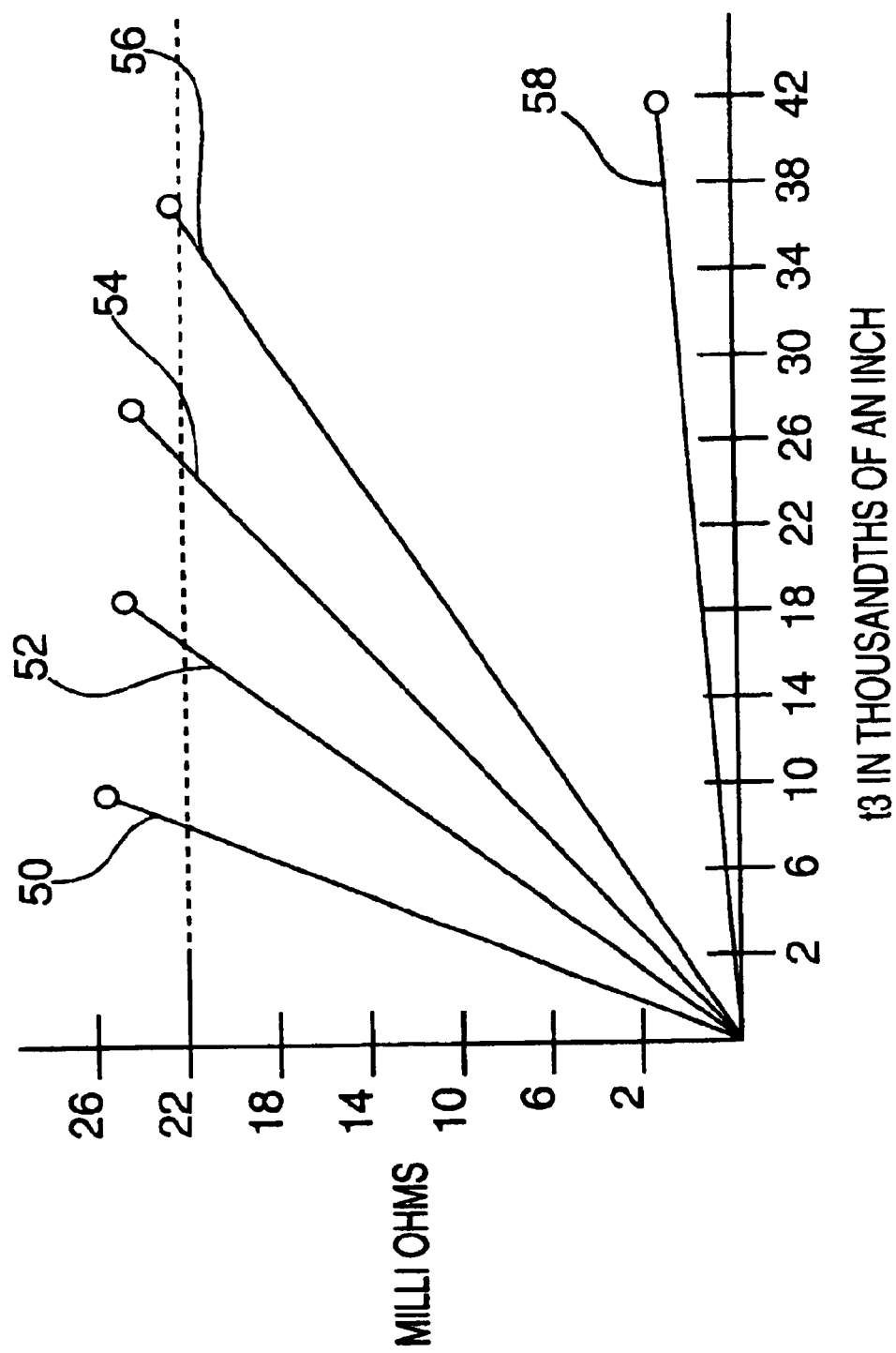
FIG. 3 is a plot showing the resistance of several different conductive polymers.

FIG. 3 shows the resistance through several conductive polymer cylinders versus the thickness "t3" of the conductive polymer from one cap to the other (i.e., one flat surface of the conductive polymer cylinder to the other). Each of the five lines shown represents a single exemplary conductive polymer composition comprising silicon, epoxy, or both. The resistivity "$\rho$" of each material in ohm centimeters, and the diameter "w" of the cylinder in inches for each conductive polymer are as follows: line 50, $\rho$=0.004 $\Omega$cm, w=0.03"; line 52, $\rho$=0.001 $\Omega$cm, w=0.02"; line 54, $\rho$=0.001 $\Omega$cm, w=0.025"; line 56, $\rho$=0.001 $\Omega$cm, w=0.03"; and, line 58, $\rho$=0.0001 $\Omega$cm, w=0.03". The horizontal dashed line represents the nominal limit of resistance for practical use of the conductive polymer cylinders in conventional applications. As shown in FIG. 3, a range of polymer characteristics can be incorporated in the interconnection, depending upon the required thickness of the conductive polymer in the interconnection. For example, if the conductive polymer 32 thickness t3 is 0.018", then the polymer cylinders represented by lines 54, 56, and 58 could be utilized successfully in the interconnection. Further, different conductive polymer combinations can be used to increase or decrease the resistivity as needed in any given application. The conductive polymers represented in FIG. 3 are exemplary, and, as discussed above, many other geometries are possible and within the scope of this invention.

Fabrication of the interconnection begins with formation of the caps 34, 36. The cap material is formed into the desired shape using conventional techniques, such as casting, pressing, stamping, coining, or etching, with coining preferred.

If the conductive polymer is a thermoplastic polymer, an appropriately shaped plug of the fully polymerized conductive polymer 32 is applied to a cap. The plug is formed using conventional techniques, such as screen printing, casting columns, extrusion processes, molding, or punching, with casting preferred. An opposing cap is then applied to the conductive polymer 32 opposite the first cap, and the thermoplastic conductive polymer 32 is heated to bind the caps 34, 36 to the conductive polymer 32. The resulting interconnection is shown in FIG. 2. If the conductive polymer is not a thermoplastic polymer, a thin layer of a conductive thermoplastic polymer can be formed on the surfaces of the non-thermoplastic conductive polymer 32 on which the caps 34, 36 will be disposed prior to application of the caps 34, 36 and heating.

Alternatively, the appropriate amount of uncured polymer can be applied to one of the caps in a viscous liquid state, and the opposing cap can be moved into the correct final interconnection position relative to the first cap, where the opposing cap will be in contact with the uncured polymer. The uncured polymer is then cured to complete fabrication of the interconnection.

Figure 4:
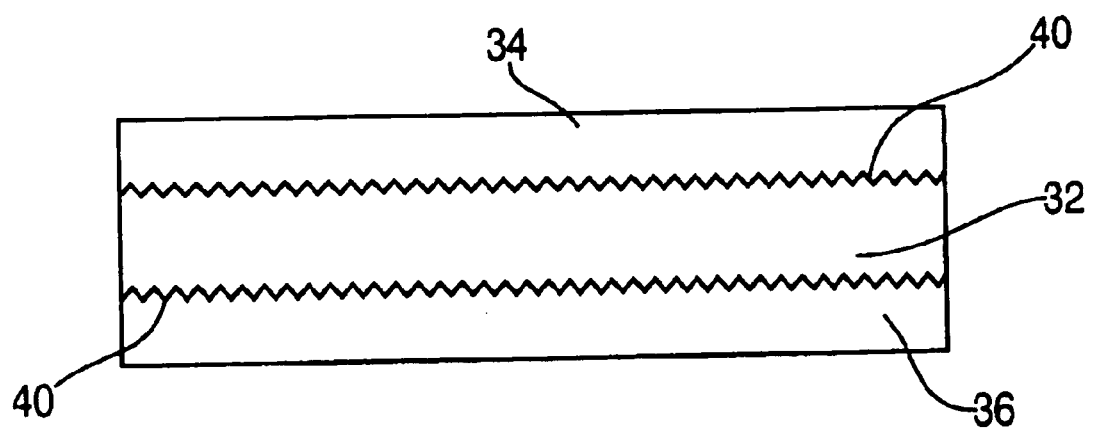
FIG. 4 is a cross sectional view of one embodiment of a conductive polymer interconnection showing serrated caps.

To improve the bond between the caps 34, 36 and the conductive polymer 32, the surface of each cap 34, 36 to which the conductive polymer 32 bonds can be altered. As shown in FIG. 4, a serration 40 or other form of scoring can be formed on the surface of each of the caps 34, 36. The serration 40 can be formed in any conventional manner, including etching, coining, and scoring, among others. The serrations 40 provide more surface area for the bond between the caps 34, 36 and the conductive polymer 32, and help prevent delamination of the caps 34, 36 from the conductive polymer 32.

The technique by which the finished interconnection is attached to the integrated circuit (IC) substrate and the card will now be described. Referring now to FIG. 5a, completed interconnections are affixed to the IC substrate 62 using conventional solder techniques. A connecting layer 60 is disposed between each interconnection 30 and substrate contact pad 64, and the connecting layer 60 is used to connect the second solderable cap 34 to the IC substrate contact pads 64 during soldering. The connecting layer 60 can be solder flux and eutectic solder, or other conventional soldering materials, among others.

Figure 5C:
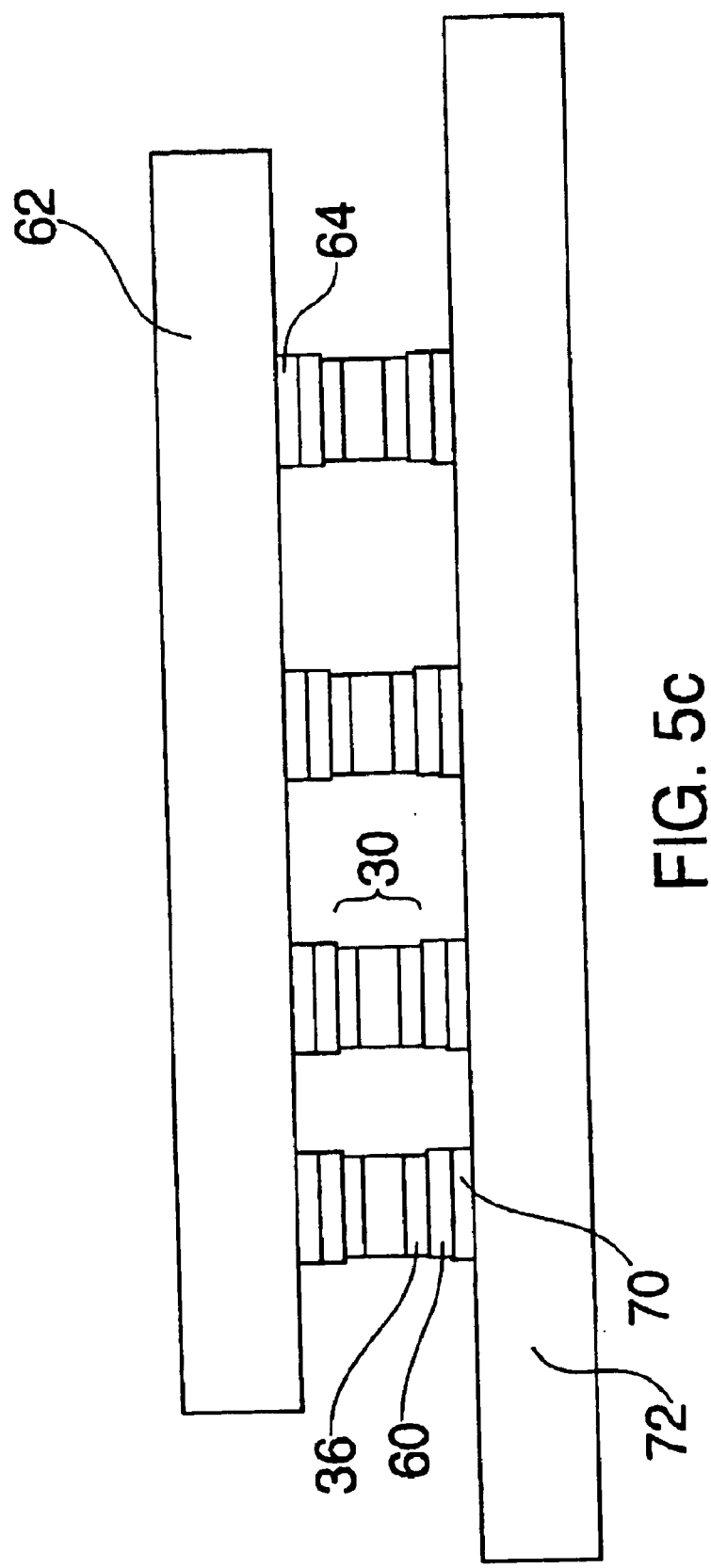
FIG. 5c is a cross sectional view of the conductive polymer interconnections of FIG. 5b after completion of attachment.

The IC substrate 62 with affixed interconnections 30 can then be used in a conventional manufacturing line in which IC substrates are soldered to cards. The IC substrate 62 with affixed interconnections 30 is moved into position so as to align the interconnections 30 with the card contact pads 70. As shown in FIG. 5b, the contact pads 70 on the card 72 have a connecting layer 60 in place in contact with the card contact pads 70. The connecting layers 60 on the card contact pads 70 can be applied, for example, using conventional masking techniques, and can be the same material as the connection layers 60 on the IC substrate 62. Referring now to FIG. 5c, the IC substrate 62 with affixed interconnections 30 is then moved so that the first solderable caps 36 contact the connecting layers 60 on the card contact pads 70. To complete the connection, the first solderable caps 36, the card contact pads 70, and the connecting layers 60 on the card contact pads 70 are heated to form a solder connection between the first solderable caps 36 and the card contact pads 70. Since each interconnection 30 is connected to the components through solderable connections, the interconnections 30 can be used invisibly in place of ball grid arrays and other conventional arrays. Further, since the interconnections 30 are soldered, the IC substrate 62 can be removed from the card 72 by reflowing the solder connections.

FIGS. 6a through 6d show alternative embodiments of the interconnection described above. Each of the embodiments shown in FIGS. 6a through 6d can be manufactured and incorporated into IC substrates and cards as described above, and can have the same cross sectional geometry, composition, and size, as described above.

Figure 6A:
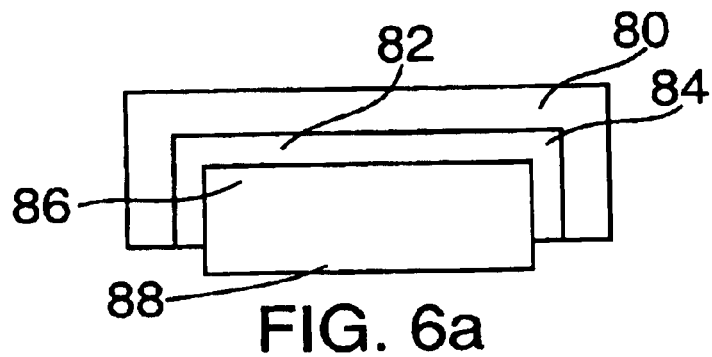
FIG. 6a is a cross section of one embodiment of a conductive polymer interconnection.

FIG. 6a illustrates one embodiment of an interconnection wherein the second solderable cap 80 defines a cavity 82. The conductive polymer 84 and a top portion 86 of the first solderable cap 88 are disposed within the cavity 82. Either solderable cap 80, 88 can be disposed against the contact pad 64 of the IC substrate 62.

Figure 6B:
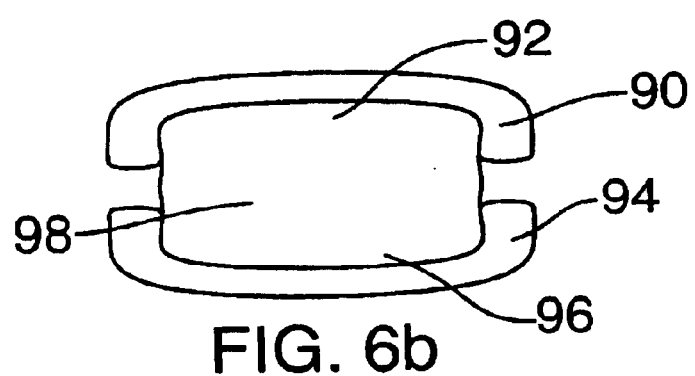
FIG. 6b is a cross section of one embodiment of a conductive polymer interconnection.

FIG. 6b illustrates another embodiment of an interconnection wherein the second solderable cap 90 defines a first cavity 92 and the first solderable cap 94 defines a second cavity 96. The second solderable cap 90 and the first solderable cap 94 are oriented so that the cavities 92, 96 face each other, and the conductive polymer 98 is disposed in contact with and between the caps 90, 94 and within each cavity 92, 96.

Figure 6C:
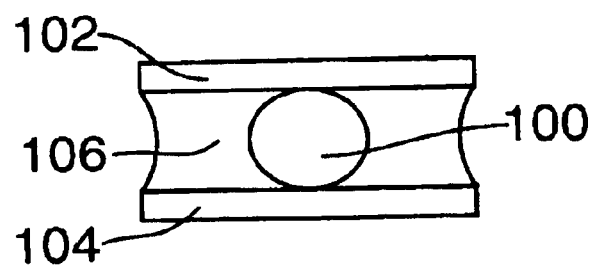
FIG. 6c is a cross section of one embodiment of a conductive polymer interconnection.

FIG. 6c illustrates another embodiment of an interconnection wherein a conductive solid 100 is disposed between the second solderable cap 102 and the first solderable cap 104, and within the conductive polymer 106. The conductive solid 100 can be any shape, with an approximately sphere-shaped solid preferred, and can be any conductive material that is compatible with the other components of the interconnection, such as copper, nickel, gold and alloys and mixtures comprising at least one of the foregoing, with gold plated copper or nickel preferred.

Figure 6D:
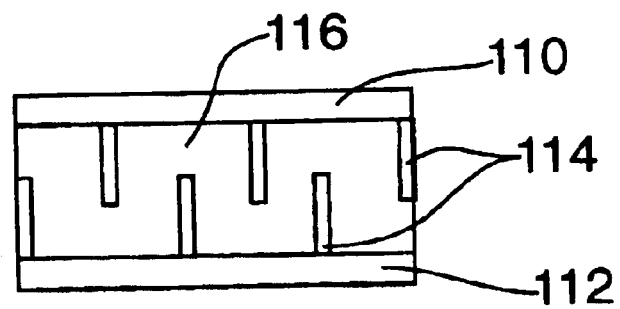
FIG. 6d is a cross section of one embodiment of a conductive polymer interconnection.

FIG. 6d illustrates yet another embodiment of an interconnection, wherein the second solderable cap 110 and the first solderable cap 112 each have projections 114 protruding into the conductive polymer 116. The projections 114 can have any shape and orientation relative to the caps 110, 112, with a cylindrical or rectangular solid shape preferred, and an orthogonal orientation relative to the long axis of the caps 110, 112 preferred. The location of the projections 114 can be different, or alternate between the caps 110, 112, as shown in FIG. 6d, or the projections 114 can be shortened and located opposite each other on the caps 110, 112. The projections 114 can be the same material as the caps 110, 112, or a different material chosen for its physical or electrical properties.

Although FIGS. 6a through 6d illustrate several alternative embodiments of an interconnection, one skilled in the art will realize that other cap and conductive polymer configurations are possible and within the scope of this invention.

Figure 7:
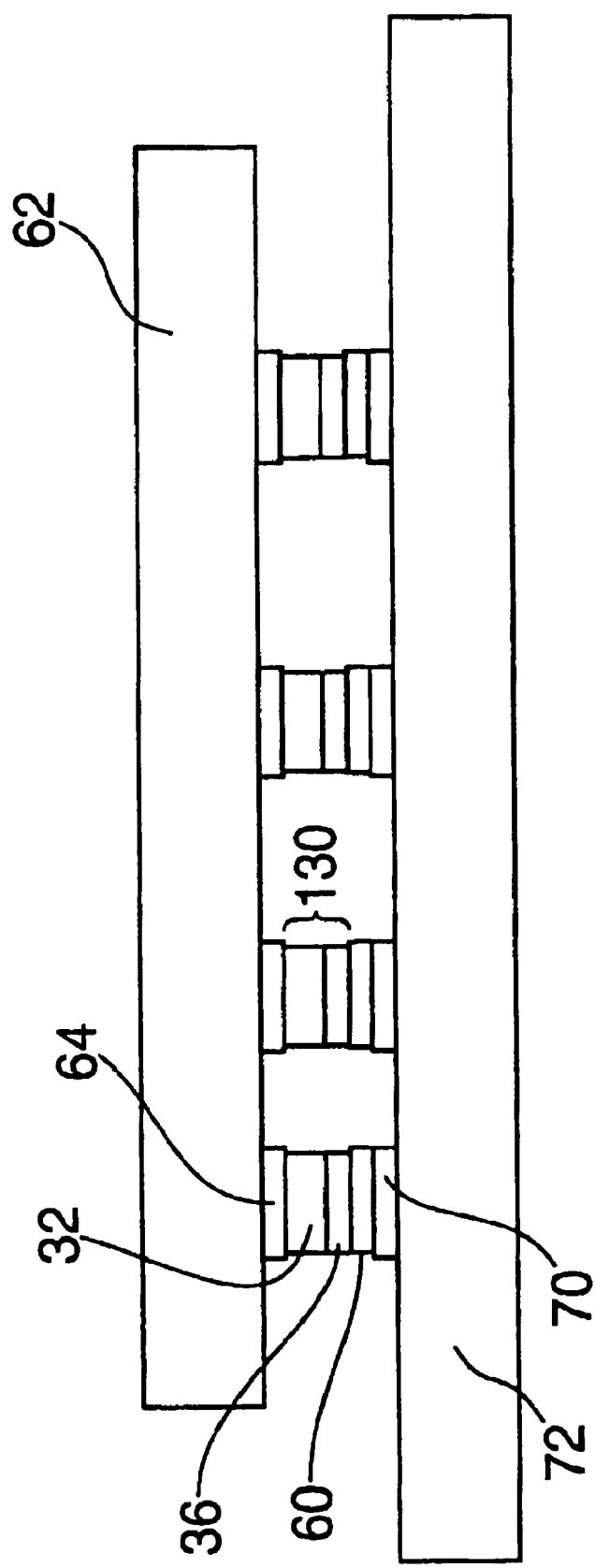
FIG. 7 is a cross sectional view of one embodiment of a conductive polymer interconnection having only a single cap.

In yet another alternative embodiment of the interconnection of the present invention, the conductive polymer 32 can be affixed directly to the contact pads on one of the electronic devices instead of one of the solderable caps. FIG. 7 illustrates this embodiment. The conductive polymer 32 in this embodiment is disposed in contact with the contact pad 64 of the IC substrate 62 rather than a solderable cap. The first solderable cap 36 is disposed in contact with the conductive polymer 32 as before to form a single cap and conductive polymer interconnection 130. Although FIG. 7 shows the conductive polymer 32 disposed in contact with the contact pad 64 of the IC substrate 62, which is preferable, the interconnection 130 could be inverted, with the conductive polymer 32 disposed in contact with the card contact pad 70 and the first solderable cap 36 disposed in contact with a connecting layer on the IC substrate contact pad 64. Also, the first solderable cap 36 can be disposed on the conductive polymer 32 first, and then the conductive polymer 32 can be disposed on the contact pad 64.

In this embodiment, the interconnection 130 is formed as before, except that one of the contact pads 64, 70 is used in place of the second solderable cap. For example, in the case of a thermoplastic polymer as above, in one embodiment, an appropriately shaped plug of conductive polymer can be placed on each of the contact pads 64 of the IC substrate 62, a first solderable cap 36 is located on each of the conductive polymer plugs, and the interconnection 130 is heated and cooled appropriately to form the interconnection 130. Likewise, for a non-thermoplastic polymer as above, in one embodiment, the uncured conductive polymer 32 can be applied to the substrate contact pads 64 as a viscous liquid, a first solderable cap can be applied to the uncured conductive polymer 32, and the conductive polymer 32 can be cured to form the interconnection 130. Further, for this one cap embodiment, all of the variously shaped cap embodiments described above for the two cap embodiment can be used, the conductive polymers and caps can comprise the same materials listed above, the same dimensions as given above for the caps and the conductive polymer apply, and the methods for forming the caps, conductive polymer, and interconnection, as well as for incorporating the interconnection into an IC substrate and card connection, can be used for this embodiment where appropriate.

Figure 8:
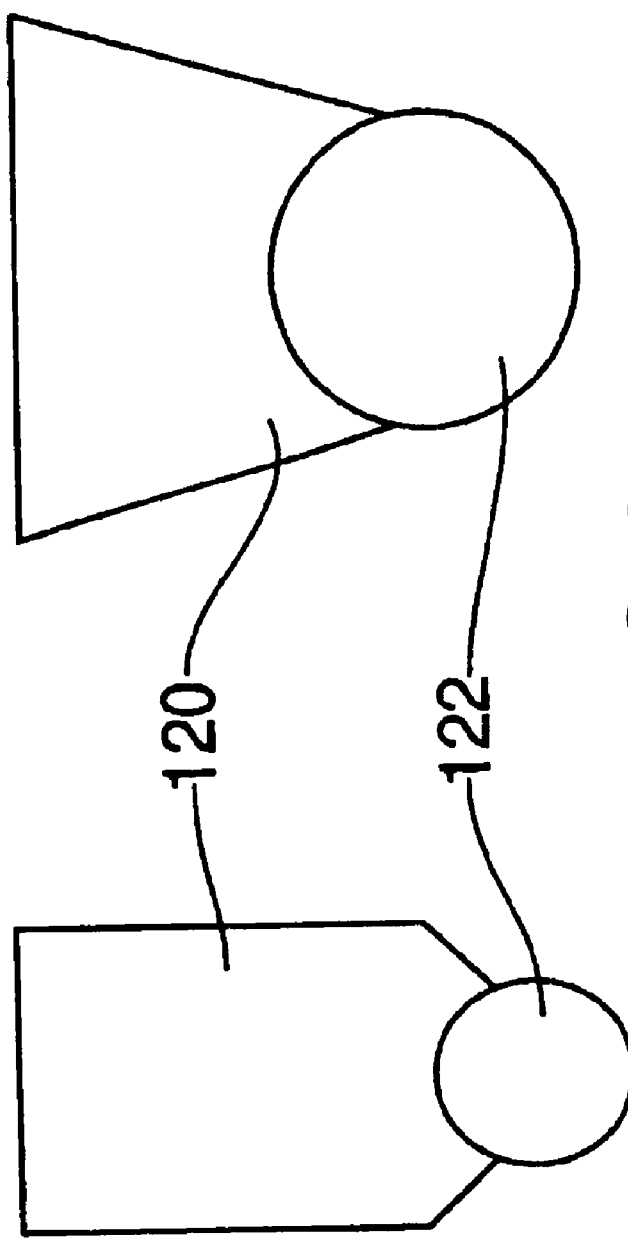
FIG. 8 is a cross sectional view of two embodiments of conductive polymer interconnections having a solder ball as the single cap; and, FIG. 9 is a plot showing the preferred application range of the present invention.

In another embodiment of the present invention only the first solderable cap is used, and the first solderable cap is a solder ball. FIG. 8 shows two different embodiments of an interconnection having a solder ball as the first solderable cap. The solder balls 122 can be formed in contact with the conductive polymer 120 is the same manner as before, with casting column methods preferred, and the conductive polymer 120 and solder ball 122 interconnection can be applied to the IC substrate 62 and card 72 as before. The interconnection arrays formed by this embodiment are called enhanced ball grid arrays, and can be used in high density interconnection applications.

Figure 9:
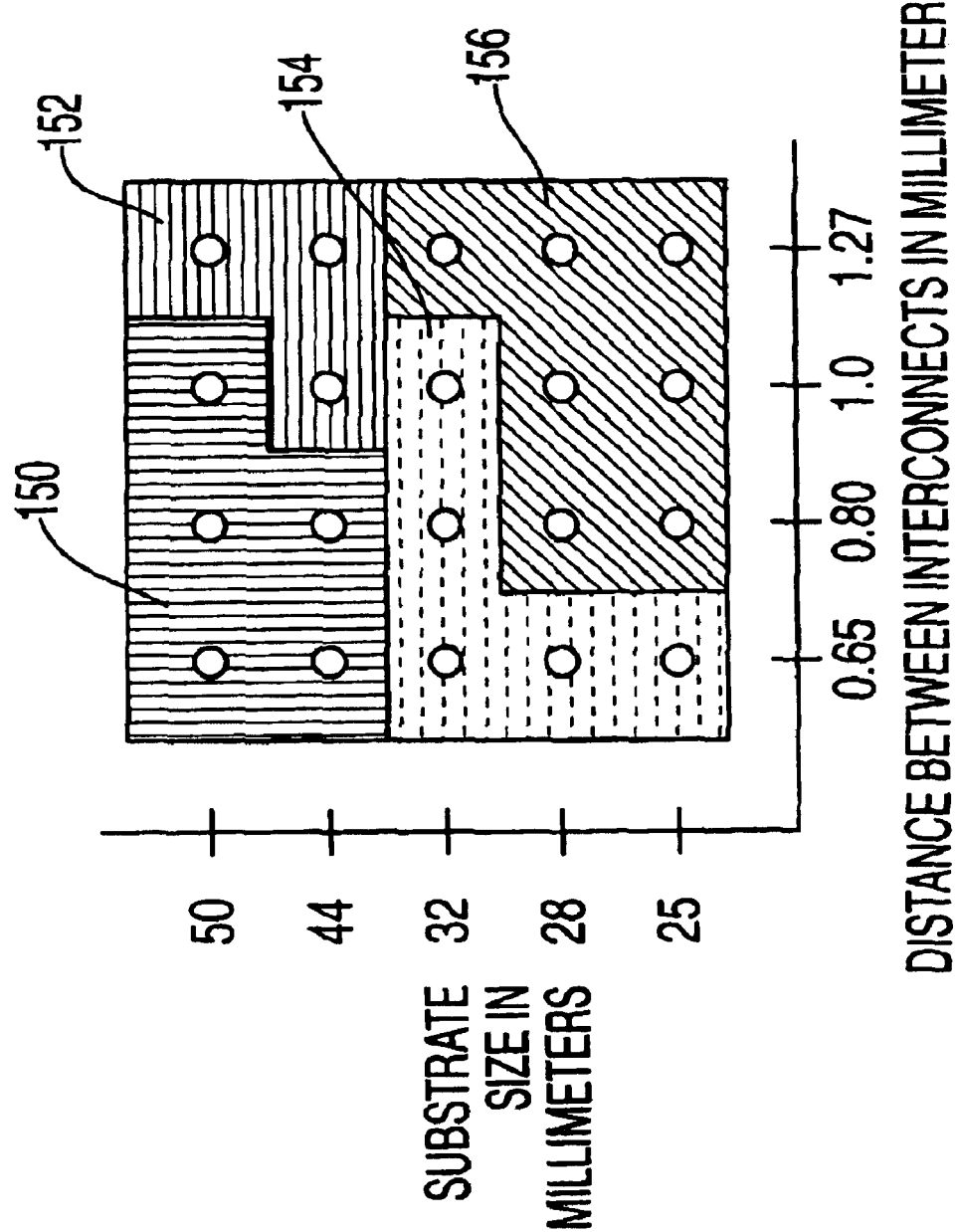

The conductive polymer interconnections described above can be used in applications where either large IC substrate size or a high density interconnection requirement preclude the use of conventional ball grid arrays or column grid arrays. FIG. 9 represents potential applications of the above-described interconnections. The y-axis represents the size of the IC substrate in millimeters, and the x-axis represents the minimum distance between the centers of interconnections (interconnection pitch or density). Shaded area 156 represents the application range of conventional ball grid arrays, and shaded area 152 represents the application range of conventional column grid arrays. While column grid arrays overcome the substrate size limitation of ball grid arrays, however, they do not allow for high interconnection density. Shaded area 154 represents the preferred application range of enhanced ball grid arrays formed with the one cap solder ball interconnections of the present invention (the enhanced ball grid array can be used in less dense interconnection applications as well, of course). Finally, shaded area 150 represents the preferred application range of the one cap interconnections (not including the solder ball cap) and two cap interconnections described above, both of which can, of course, be successfully used in the other application ranges as well, if desired.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the appended claims.

What is claimed is:

1. A method of forming an electrical connection between two devices, comprising:

bonding a completed interconnection on a first contact pad of a first component, wherein said completed interconnection comprises a conductive polymer composition comprising a polymer component and an electrically conductive component; and a first solderable cap disposed in substantially planar contact with said conductive polymer composition; and, soldering said first solderable cap to a second contact pad of a second component.

2. The method of claim 1, wherein said polymer component comprises a thermoplastic polymer, a copolymer, or a blend, and said electrically conductive component comprises electrically conductive particles.

3. The method of claim 2, wherein said polymer component comprises a nylon, polysulfone, polyester, polyimide, siloxane, ethylene, vinyl acetate, aryl-ether, polyutethane; polyisocyanate, polyether, polyester, acrylate, or polyvinyl chloride.

4. The method of claim 2 wherein said electrically conductive particles comprise gold, silver, palladium, oxide free noble alloys of gold, silver, and palladium, or a noble metal.

5. The method of claim 1, wherein said first solderable cap comprises gold, nickel, silver, copper, zinc, palladium, platinum, indium, tin, bismuth, or lead.

6. The method of claim 1, wherein said first solderable cap has a width and a thickness, and said width is about 0.010 inches to about 0.050 inches, and said thickness is about 0.002 inches to about 0.01 inches.

7. The method of claim 1, wherein said conductive polymer composition has a width and a thickness, and said width is about 0.010 inches to about 0.050 inches, and said thickness is about 0.002 inches to about 0.058 inches.

8. The method of claim 1, wherein said conductive polymer composition has a resistivity of lees than about 0.05 ohms per centimeter.

9. The method of claim 1 wherein said bonding comprises placing said interconnection in contact with said first contact pad and healing said conductive polymer composition.

10. The method of claim 1, further comprising:

soldering a second solderable cap of said completed interconnection to said first contact pad of said first component, said second solderable cup disposed in contact with said conductive polymer composition opposite said first solderable cap.

11. The method of claim 10 wherein said polymer component comprises a thermoplastic polymer, a copolymer, or a blend, and said electrically conductive component comprises electrically conductive particles.

12. The method of claim 11, wherein said polymer component comprises:

a nylon, polysulfone, polyester, polyimide, siloxane, ethylene, vinyl acetate, aryl-ether, polyutethane, polyisocyanate, polyether, polyester, acrylate, or polyvinyl chloride.

13. The method of claim 11 wherein said electrically conductive particles comprise gold, silver, palladium, oxide free noble allays of gold, silver, and palladium, or a noble metal.

14. The method of claim 10, wherein said first solderable cap and said second solderable cap comprise gold, nickel, silver, copper, zinc, palladium, platinum, indium, tin, bismuth, or lead.

15. The method of claim 10, wherein said first solderable cap and said second solderable cup have a width and a thickness, and said width is about 0.010 inches to about 0.050 inches, and said thickness is about 0.002 inches to about 0.01 inches.

16. The method of claim 10, wherein said conductive polymer composition has a width and a thickness, and said width is about 0.010 inches to about 0.050 inches, and said thickness is about 0.002 inches to about 0.058 inches.

17. The method of claim 10, wherein said conductive polymer composition has a resistivity of less than about 0.05 ohms per centimeter.

* * * * *